United States Patent
Jang et al.

[11] Patent Number: 5,923,050
[45] Date of Patent: Jul. 13, 1999

[54] AMORPHOUS SILICON TFT

[75] Inventors: Jin Jang; Jae-seong Byun; Hong-bin Jeon, all of Seoul, Rep. of Korea

[73] Assignee: Samsung Electronics Co., Ltd., Kyungki, Rep. of Korea

[21] Appl. No.: 08/589,713

[22] Filed: Jan. 24, 1996

[30] Foreign Application Priority Data

Feb. 8, 1995 [KR] Rep. of Korea .......................... 95-2187
Feb. 24, 1995 [KR] Rep. of Korea .......................... 95-3588

[51] Int. Cl.$^6$ .................................................. H01L 29/00
[52] U.S. Cl. ................................ 257/57; 257/59; 257/62; 257/66; 257/72
[58] Field of Search .................................. 257/57, 58, 59, 257/60, 62, 66, 72, 81

[56] References Cited

U.S. PATENT DOCUMENTS

| | | | |
|---|---|---|---|
| 4,625,224 | 11/1986 | Nakagawa et al. | 257/66 |
| 4,949,141 | 8/1990 | Busta | 257/62 |
| 5,565,691 | 10/1996 | Arai et al. | 257/66 |

*Primary Examiner*—Valencia Martin-Wallace
*Attorney, Agent, or Firm*—Pillsbury Madison & Sutro LLP

[57] ABSTRACT

An amorphous silicon thin-film transistor as a switching element for a thin-film transistor liquid crystal display, having improved characteristics by making better an ohmic contact layer and an active layer, and a method of fabricating the same are provided. A wide energy-band gap $\mu$c-Si(:Cl) fabricated using a mixed gas including $SiH_2Cl_2$ is used as the ohmic contact layer, so that yield and productivity can be improved. The active layer is formed of $\mu$c-Si:H(:Cl) with low hydrogen content and high stability. Off-current during illumination is sharply decreased, to thereby remarkably reduce leakage current when illumination is performed by backlighting.

10 Claims, 8 Drawing Sheets

AMORPHOUS SILICON TFT

BACKGROUND OF THE INVENTION

The present invention relates to a thin-film transistor (TFT), and more particularly, to an amorphous silicon TFT wherein an ohmic contact layer and active layer are improved and to a fabricating method thereof.

Thin-film transistors generally include an active layer of amorphous silicon, polysilicon or cadmium-selenium and have been widely employed as the pixel-driving elements of a liquid crystal display device. Particularly, a hydrogenated amorphous silicon (a-Si:H) TFT is advantageous to the production of large-screen displays and facilitates mass production. When employing the a-Si:H layer, the main concerns are enhancing field-effect mobility while maintaining a low off-current characteristic. Here, it should be noted that the high photo-conductivity properties of hydrogenated amorphous silicon generate high levels of leakage current under backlight illumination, and if a high-intensity backlight is adopted, as in the case of projection-type displays, the leakage current becomes a serious problem. Thus, reducing the photo leakage-current of an a-Si:H TFT is an essential task to obtain a high quality TFT-LCD. Though the leakage current can be lowered by reducing the thickness of an undoped a-Si:H layer, unfortunately, this also decreases field-effect mobility.

Recently, however, an $n^+$-type microcrystalline silicon ($n^+$ $\mu$c-Si) having a wide energy-band gap has been developed using $SiH_2Cl_2$ gas and applied to fabricate an a-Si:H TFT having low leakage current. In contrast to $n^+$a-Si:H, $n^+$ microcrystalline silicon has a relatively low sheet resistance and high conductivity, so that hole current is effectively blocked during an off-operation of the TFT and on-current is increased.

Meanwhile, the structure of the amorphous silicon TFT can be roughly classified into staggered and coplanar types according to the location of a patterned active layer. In the case of the staggered type, a gate electrode and source/drain electrode are separated by an interposed semiconductor layer, differently from the coplanar type in which the electrodes are all formed in the same side of a semiconductor layer. Here, the most widely used amorphous silicon TFT is the inverse-staggered type.

FIG. 1 is a cross-sectional view of a conventional inverse-staggered type amorphous silicon TFT.

As shown in FIG. 1, gate 11 consisting of a metal pattern of chromium or aluminum is formed on insulating substrate 10, and gate insulating layer 12 made of nitride is formed on the whole surface of the resultant. On gate insulating layer 12, the channel of the TFT is formed of a patterned layer of hydrogenated amorphous silicon, as active layer 13, and source/drain 15 is formed on both sides of the active layer. Then, to improve ohmic characteristics, ohmic contact layer 14 doped with a high concentration of n-type impurities is formed between active layer 13 and source/drain electrode 15. Here, the $n^+$ $\mu$c-Si used as ohmic contact layer 14 is formed by depositing $H_2/SiH_4$ gas (mixed with a ratio of 10:1) or $SiF_4/H_2/SiH_4$ gas using a plasma-enhanced chemical vapor deposition (PECVD) method.

However, if $H_2/SiH_4$ gas is used for depositing the conventional $n^+$ $\mu$c-Si layer, the deposition rate is remarkably decreased and particles are generated, due to the etching effect of hydrogen. On the other hand, if $SiF_4$ gas is used in the deposition, the previously deposited a-Si:H layer (active layer 13) is damaged by ions which are accelerated by $SiF_4$ decomposed at a high RF power.

SUMMARY OF THE INVENTION

To solve the above problems, it is an object of the present invention to provide an amorphous silicon TFT in which an ohmic contact layer doped with a high concentration of impurities is formed of chlorine-containing microcrystalline silicon ($\mu$c-Si(:Cl)), to increase the deposition rate and prevent damage to the active layer and the generation of particles during the deposition process, and a fabricating method thereof.

It is another object of the present invention to provide an amorphous silicon TFT in which an active layer of the amorphous silicon TFT is formed of chlorine-containing hydrogenated amorphous silicon (a-Si:H(:Cl)) with low hydrogen content and high stability, to increase the quality of an amorphous silicon TFT and a fabricating method thereof.

To achieve the above first object, there is provided an amorphous silicon TFT comprising: an insulating substrate; a gate electrode formed on the insulating substrate; a gate insulating layer formed on the gate electrode; an active layer made of hydrogenated amorphous silicon formed on the gate insulating layer; a source/drain electrode formed on either side of the gate electrode; and an ohmic contact layer made of of chlorine-containing microcrystalline silicon ($\mu$c-Si (:Cl)) interposed between the active layer and the source/drain electrode.

To achieve another aspect of the first object, there is provided a method of fabricating an amorphous silicon TFT in which a gate electrode is formed on an insulating substrate, comprising the step of forming an ohmic contact layer of $\mu$c-Si(:Cl) by a plasma-enhanced chemical vapor deposition method using a $SiH_4/H_2/PH_3$ gas mixture including $SiH_2Cl_2$.

To achieve the above second object, there is provided an amorphous silicon TFT comprising: an insulating substrate; a gate electrode formed on the insulating substrate; a source/drain electrode formed on either side of the gate electrode; an active layer made of chlorine-containing hydrogenated amorphous silicon (a-Si:H(:Cl)) having a chlorine content of $0.1 \neq 10^6$ ppm; and an ohmic contact layer interposed between the channel layer and the source/drain electrode.

To achieve another aspect of the second object, there is provided a method of fabricating an amorphous silicon TFT comprising the step of forming an active layer of a-Si:H(:Cl) by a plasma-enhanced chemical vapor deposition method using a chlorine-containing gas mixture.

According to the first preferred embodiment of the present invention, the ohmic contact layer of the amorphous silicon TFT is formed of $\mu$c-Si(:Cl) using a mixed gas including $SiH_2Cl_2$, thereby increasing the deposition rate and the quality of a-Si TFT with low RF power. Thus, in fabrication of TFT-LCD, the yield of the TFT and productivity can be increased.

According to the second preferred embodiment of the present invention, the active layer of the amorphous silicon TFT is formed of a-Si:H(:Cl) with low hydrogen content and high stability, thereby lowering off-current to about 1/10 of the conventional TFT. Particularly, the off-current decreases to about 1/100 of the conventional TFT during the light illumination, so that the leakage current experienced during backlight illumination can be remarkably reduced.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Embodiment 1

Figure 1:
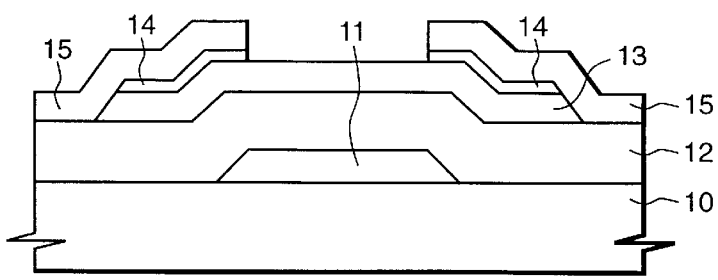
FIG. 1 is a cross-sectional view of a conventional inverse-staggered type amorphous silicon TFT.
Figure 2:
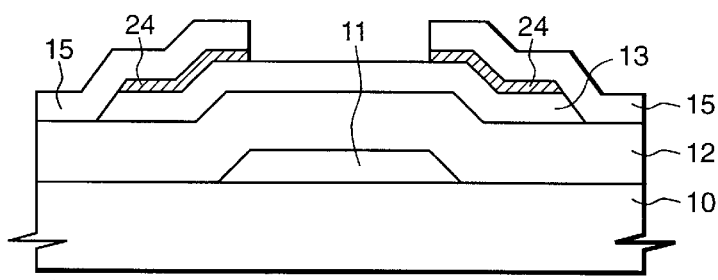
FIG. 2 is a cross-sectional view of an inverse-staggered type amorphous silicon TFT fabricated according to the first preferred embodiment of the present invention.

In FIG. 2, which is a cross-sectional view of an inverse-staggered type amorphous silicon TFT according to a preferred embodiment of the present invention, the same reference numerals as those of FIG. 1 represent corresponding portions thereof, and thus their description will be omitted.

As shown in FIG. 2, SiN$_x$ layer 12 having a thickness of about 0.3 μm and undoped a-Si:H layer 13 having a thickness of about 0.15 μm are deposited on glass substrate 10 on which gate 11 made of a metal pattern, such as chromium, is formed using the PECVD method. The a-Si:H layer 13 to be channel is deposited at 220° C. using a SiH$_4$/H$_2$ gas, and SiN$_x$ layer 12 as a gate insulating layer is deposited at 330° C. using SiH$_4$/NH$_3$ gas. Here, gate insulating layer 12 adopts a stacked structure such a SiO$_2$/SiN or Al$_2$O$_3$/SiN layer, which provides good insulating characteristics, instead of a monolayer.

Also, n$^+$ μc-Si(:Cl) layer 24 as an ohmic contact layer with about 0.05 μm thickness is interposed between Si:H layer 13 and a source/drain electrode 15. The ohmic contact layer 24 and the part of a-Si:H layer 13 within the channel region is etched using CF$_4$ plasma. Here, n$^{30}$ μc-Si(:Cl) layer 24 is deposited using the PECVD method with SiH$_4$/H$_2$/PH$_3$ gas including SiH$_2$Cl$_2$.

Figure 3:
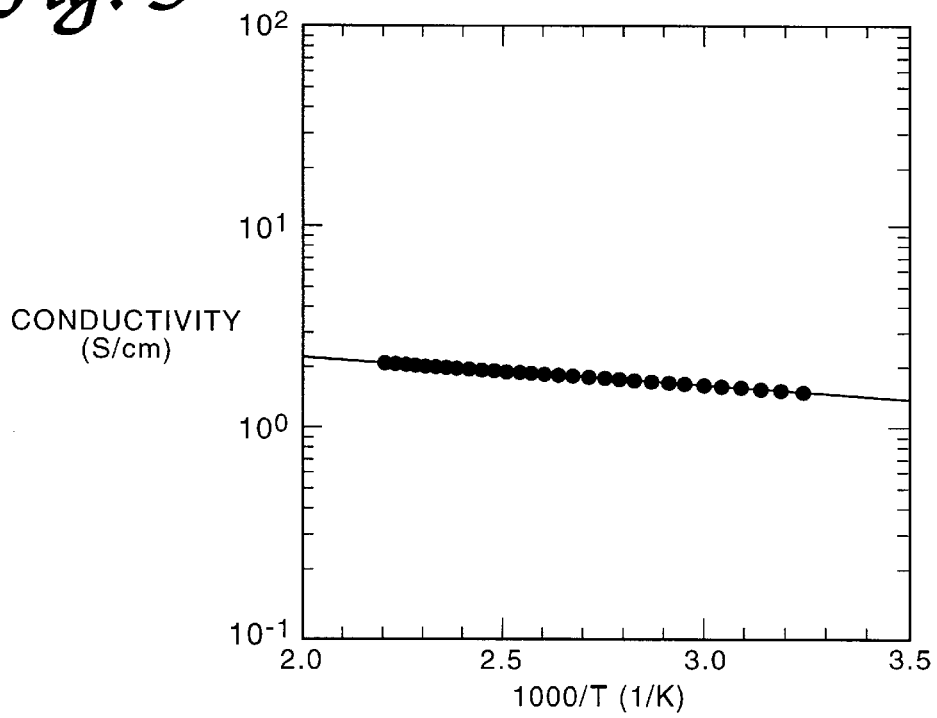
FIG. 3 is a graph showing the conductivity-vs-temperature characteristics of a n$^+$ μc-Si(:Cl) in the TFT fabricated according to the first preferred embodiment of the present invention.

FIG. 3 is a graph showing the conductivity-vs-temperature characteristics of an n$^+$ μc-Si(:Cl) layer fabricated through the above steps, in which it can be seen that the conductivity at room temperature is about 1.5 S/cm, and the conductivity activation energy is about 29 meV.

Figure 4:
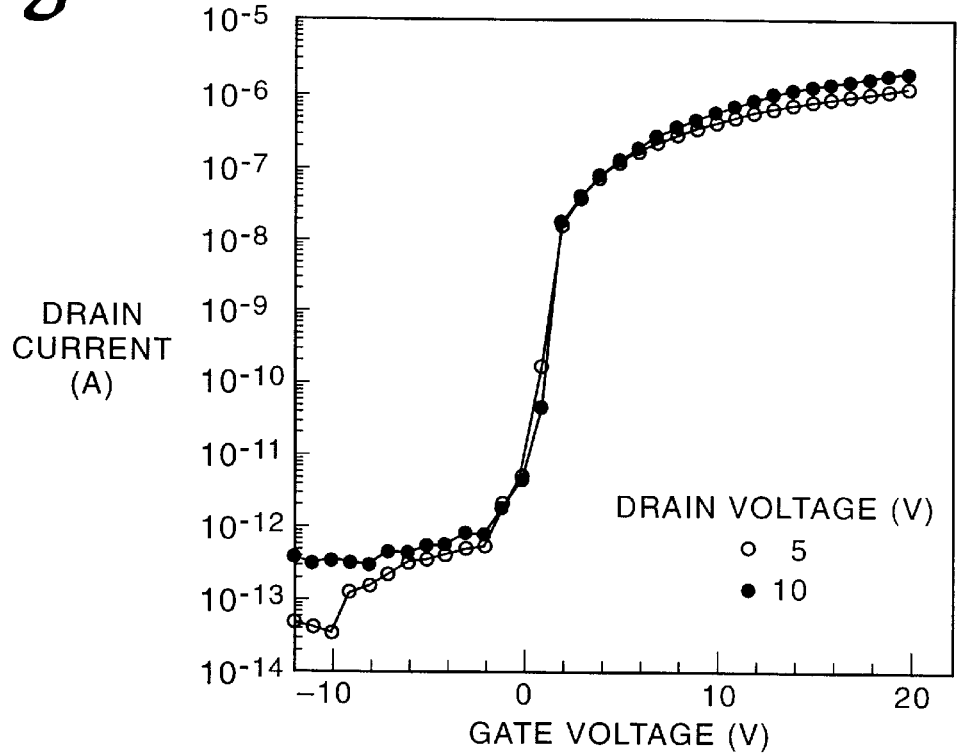
FIG. 4 is a graph showing the current-vs-voltage characteristics of the TFT according to the first preferred embodiment of the present invention.
Figure 5:
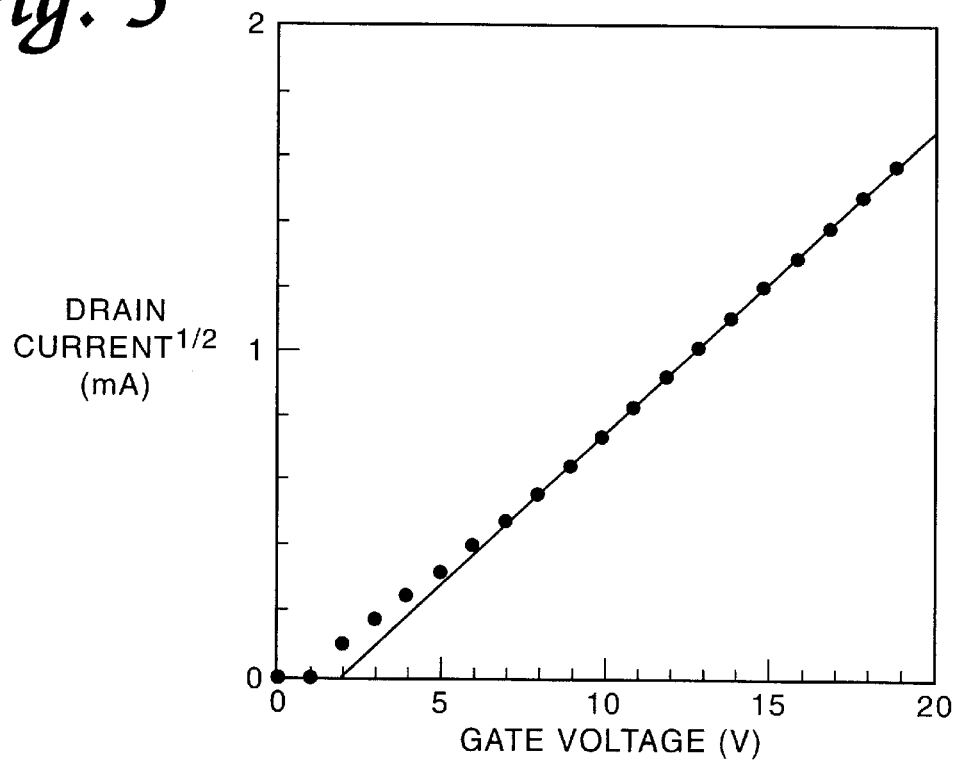
FIG. 5 is a graph showing the field effect mobility of the TFT according to the first preferred embodiment of the present invention.
Figure 6:
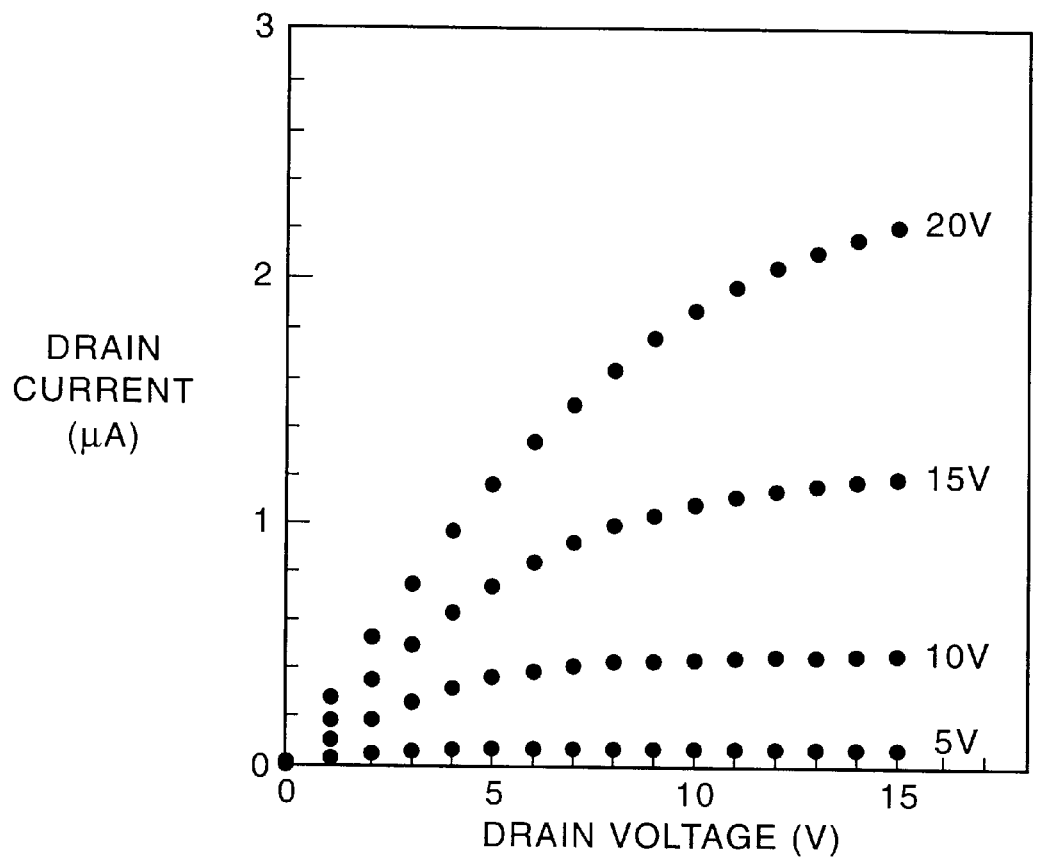
FIG. 6 is a graph showing the output characteristics of the TFT according to the first preferred embodiment of the present invention.

FIGS. 4-6 show various electrical characteristics of an amorphous silicon TFT adopting n$^+$ μc-Si(:Cl) layer 24, which is fabricated as an ohmic contact layer using SiH$_2$Cl$_2$/SiH$_4$ gas, according to the first preferred embodiment. FIG. 4 shows the current-vs-voltage characteristics. Here, the subthreshold slope is about 0.48V per decade and the on/off current ratio is greater than 10$^6$. From FIG. 5, which shows the field effect mobility of the above TFT, it can be seen that the threshold voltage is about 2.1 V and field effect mobility is 0.58 cm$^2$/Vs. FIG. 6 shows TFT output characteristics, with the drain current being nearly saturated at 2.2 μA given a gate voltage of 20 V. The n$^+$μc-Si(:Cl) TFT fabricated using SiH$_2$Cl$_2$/SiH$_4$ gas provides good characteristics as the ohmic layer of a-Si:H TFT.

As described above, according to the first preferred embodiment, the wide band gap n$^+$ μc-Si is fabricated as the ohmic contact layer using SiH$_2$Cl$_2$SiH$_4$ gas, which has less hydrogen gas than the conventional n$^+$ μc-Si. As a result, the deposition rate and the yield both increase, and the particle generation rate can be remarkably reduced compared with the conventional n$^+$ μc-Si. Also, differently from SiF$_4$ which damages the channel region by being decomposed at higher RF power, SiH$_2$Cl$_2$ can prevent such channel damage.

Embodiment 2

The second preferred embodiment relates to a TFT adopting a-Si:H(:Cl) as an active layer of the amorphous silicon TFT.

Figure 7:
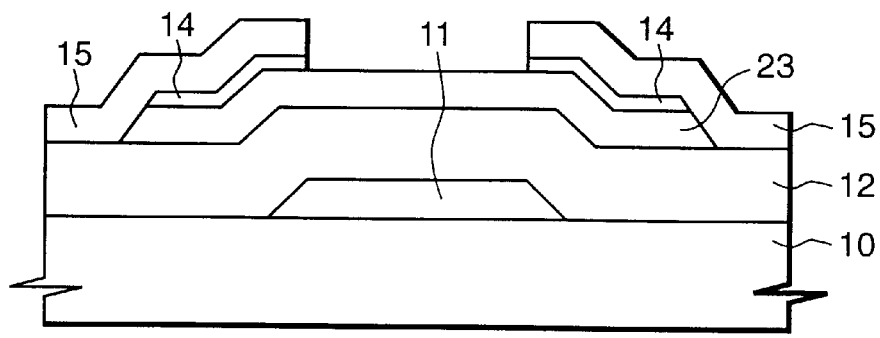
FIG. 7 is a cross-sectional view of an inverse-staggered type amorphous silicon TFT according to the second preferred embodiment of the present invention.

FIG. 7 shows the cross-sectional view of an inverse-staggered type amorphous silicon TFT fabricated according to the second preferred embodiment of the present invention. Here, as in the first embodiment, a metal layer such as chromium or aluminum is deposited and patterned as gate electrode 11 atop insulating substrate 10, and then a silicon nitride as gate insulating layer 12 and a-Si:H(:Cl) as active layer 23 are deposited by a plasma enhanced chemical vapor deposition. Thereafter, ohmic contact layer 14 is formed of n$^+$ Si or n$^+$ μc-Si and then a source/drain 15 is formed using aluminum or chromium.

Also, the TFT may be fabricated with an etching stopper type structure using an etching stopper 25 so as to thin a-Si:H(:Cl) layer 23. Also, to increase the yield in mass production, a stacked structure such as SiO$_2$/SiN or Al$_2$O$_3$/SiN may be adopted instead of the single gate insulating layer 12.

Generally, since amorphous silicon is used as active layer 23 in the amorphous silicon TFT, the amorphous silicon influences the characteristics of the TFT. Here, the amorphous silicon is deposited using SiH$_4$ or SiH$_4$/H$_2$ gas which is decomposed via a glow discharging process with PECVD equipment.

According to the second preferred embodiment, when a gas including chlorine, such as $SiH_2Cl_2$, $SiCl_4$ or $SiHCl_3$, is used for fabricating the amorphous silicon, Si—H and a Si—Si with weak bond energies are removed during the deposition process by the etching effect of the chlorine incorporated into the plasma, thereby providing high-quality amorphous silicon to improve the electrical characteristics of the TFT.

Figure 8B:
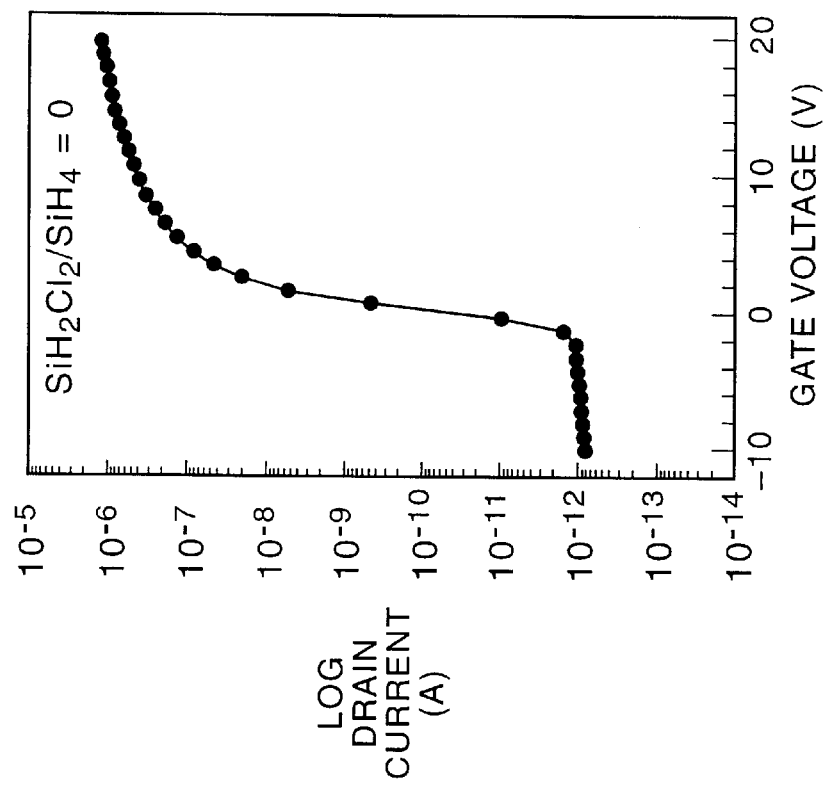
FIGS. 8A and 8B are graphs comparing the current-vs-voltage characteristics of a TFT fabricated according to the second preferred embodiment of the present invention and the conventional TFT.
Figure 8A:
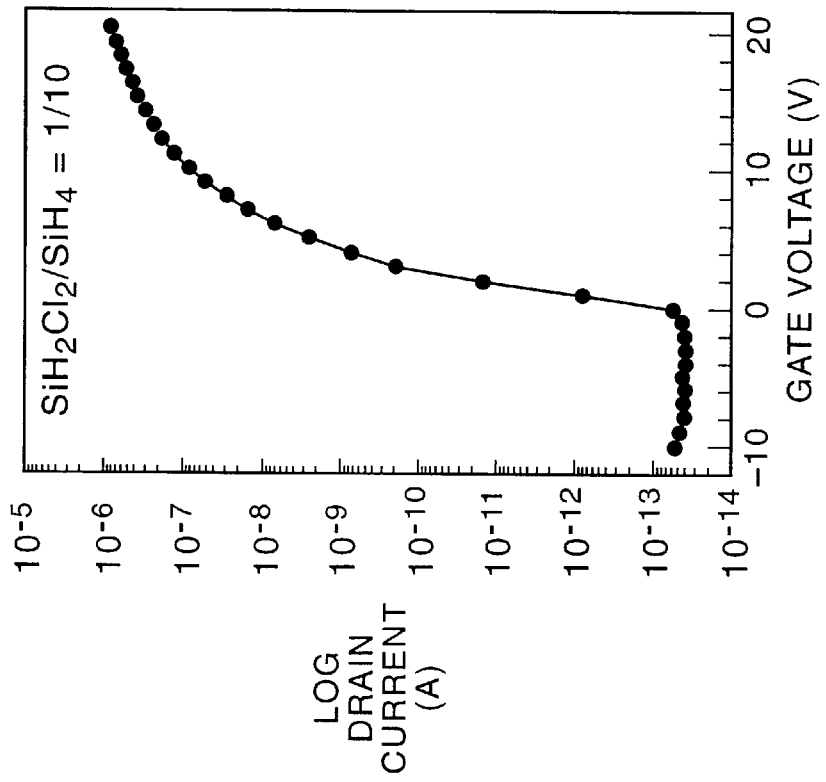

FIGS. 8A and 8B compare the current-vs-voltage characteristics of the TFT fabricated according to the second preferred embodiment of the present invention, with those of the conventional TFT, wherein the former (FIG. 8A) comprises an active layer including chlorine and the latter (FIG. 8B) comprises an active layer without chlorine. From the transfer curves shown in FIGS. 8A and 8B, it can be seen that the off-current of the amorphous silicon TFT according to the present invention decreases to about 1/10 that of the conventional amorphous silicon TFT, since the incorporated chlorine lowers the conductivity of the amorphous silicon. Also, the subthreshold slope of the a-Si:H(:Cl) TFT is about 0.36V per decade and the on/off current ratio is greater than $10^6$. Here, the drain voltage is 5V.

Figure 9:
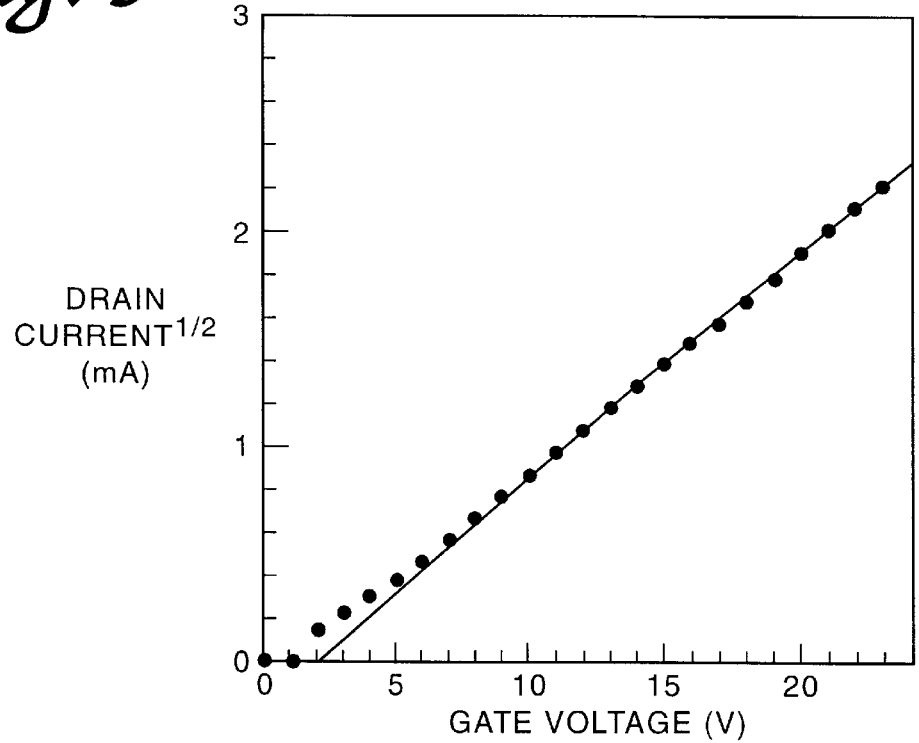
FIG. 9 is a graph showing the field effect mobility of the TFT according to the second preferred embodiment of the present invention.

FIG. 9 is a graph showing the field effect mobility of the above TFT. The threshold voltage ($V_{TH}$) and field effect mobility ($\mu_{FE}$) calculated from $\sqrt{I_D}=[\mu_{FE}(W/L)C_i(V_G-V_{TH})V_D]^{1/2}$ are about 1.8 V and 0.72 $cm^2$Ns, respectively, while, the field effect mobility of the TFT fabricated with the amorphous silicon without chlorine according to the same process is 0.70 $cm^2$/Vs. That is, field effect mobility is not influenced by the incorporated chlorine.

Figure 10:
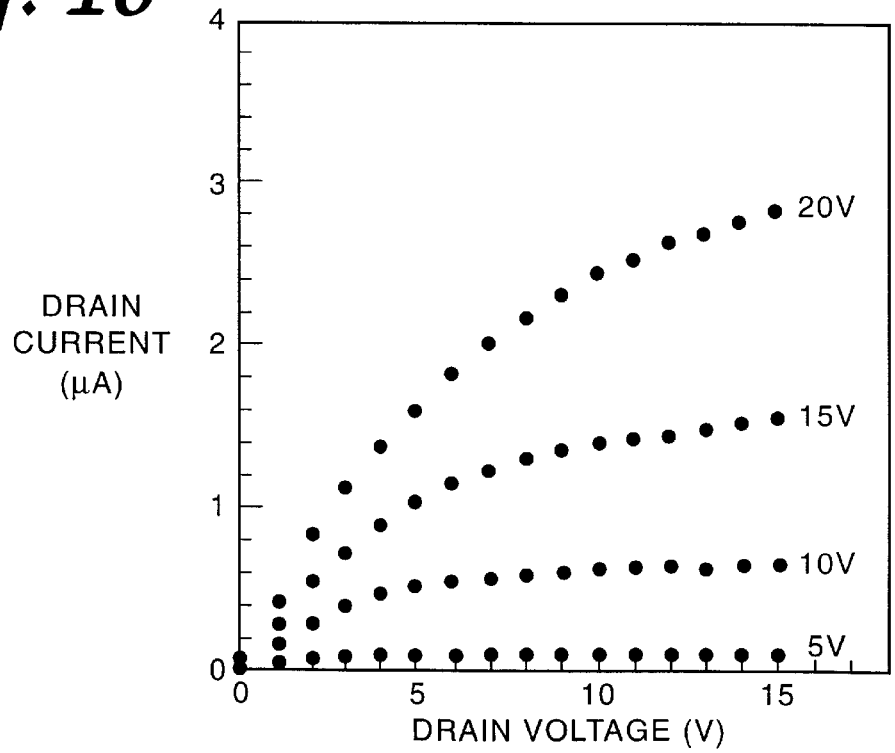
FIG. 10 is a graph showing the output characteristics of the TFT according to the second preferred embodiment of the present invention.

FIG. 10 shows the output characteristics of an a-Si:H(:Cl) TFT in which chlorine of about $7\times10^{18}$ $cm^{-3}$ is incorporated into an active layer which is fabricated using a mixed gas including $SiH_2Cl_2$. As shown in FIG. 10, the drain current is saturated at 2.8 $\mu$A given a gate voltage of 20V, with the width-to-length (W/L) ratio of the TFT being 60 $\mu$m/30 $\mu$m.

Figure 11:
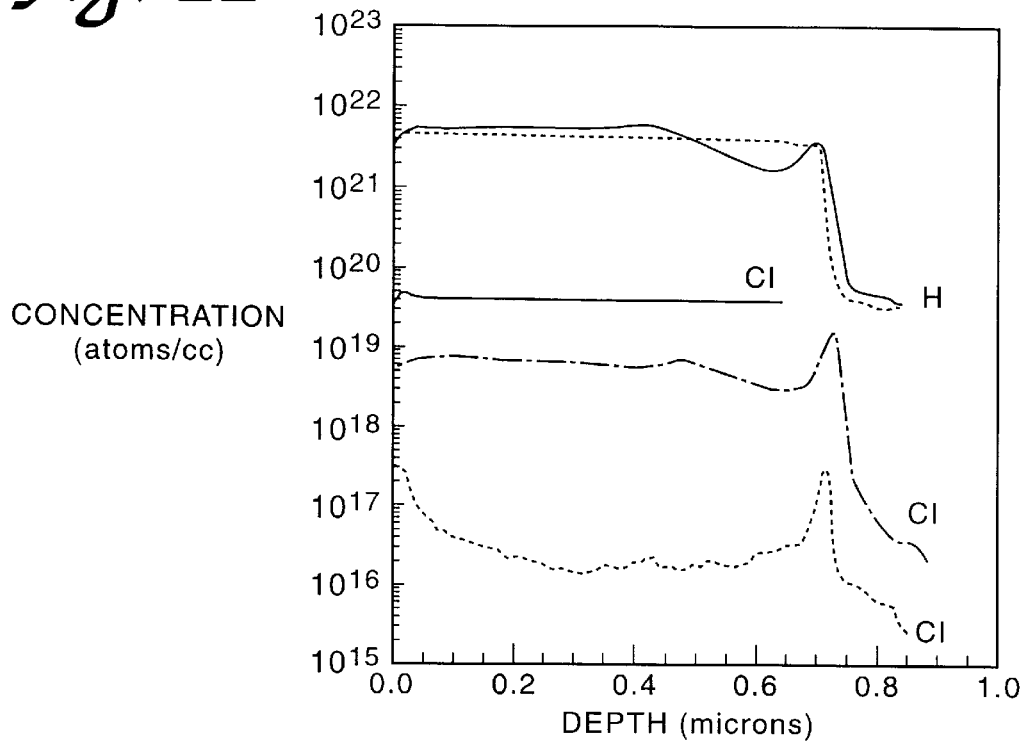
FIG. 11 is a graph showing the chlorine concentration in the active layer of the TFT according to the second preferred embodiment of the present invention.

FIG. 11 is a graph showing the chlorine concentration in the active layer of the TFT fabricated using $SiH_2Cl_2/SiH_4$ gas according to the second preferred embodiment of the present invention, measured using a secondary ion mass spectrometer. Here, a solid line, a dot-and-dash line, and a dotted line represent the chlorine concentration when the ratio of $SiH_2Cl_2$ to $SiH_4$ is 0.2 (i.e., $4\times10^{19}$ $cm^{-3}$)0.1 (i.e., $7\times10^{18}$ $cm^{-3}$) and zero, respectively. Thus, it is shown that the chlorine concentration in a-Si:H(:Cl) of the TFT increases together with the increase of the $SiH_2Cl_2$-to-$SiH_4$ ratio. Also, it can be seen that chlorine is still detected even when the ratio is zero. This is because chlorine is getting removed from a chamber wall during the deposition process.

Figure 12:
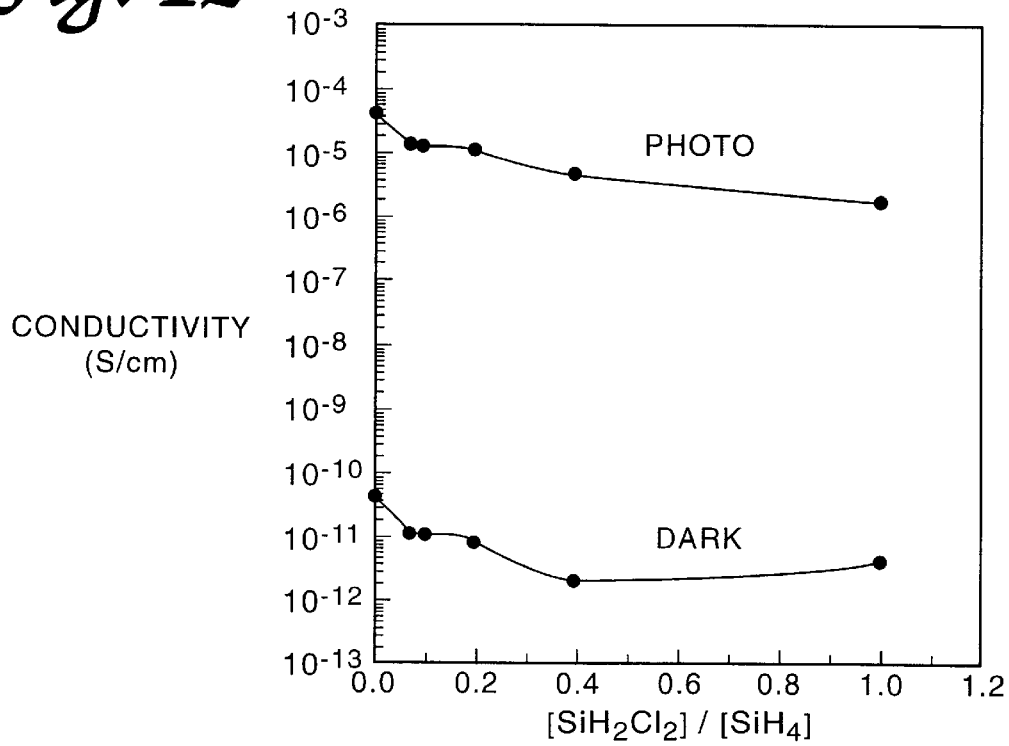
FIG. 12 is a graph showing the photo- and dark-conductivity of the active layer in the TFT according to the second preferred embodiment of the present invention.

FIG. 12 shows the photo- and dark-conductivity of the a-Si:H(:Cl) active layer in the TFT fabricated according to the second preferred embodiment of the present invention, in accordance with the ratio of $SiH_2Cl_2$ to $SiH_4$. Here, the photo-conductivity is measured under the condition of 100 mW/$cm^2$, that is, air mass 1.0. As shown in FIG. 12, the photo- and dark-conductivity decreases as the ratio of $SiH_2Cl_2$ to $SiH_4$ increases. This is because chlorine included in the amorphous silicon shifts a Fermi level toward a valance band $E_v$, thereby lowering the photo- and dark-conductivity.

Figure 13:
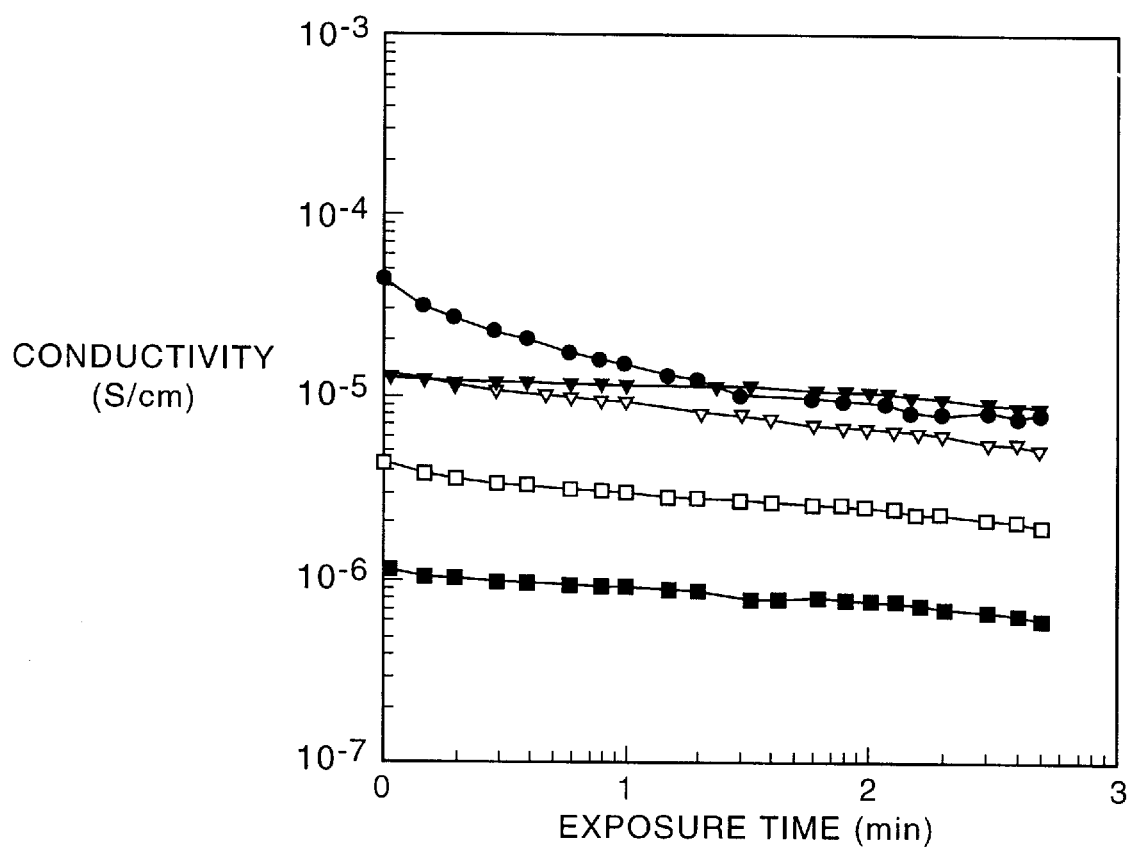
FIG. 13 is a graph showing the photo-conductivity degradation characteristics in the active layer of the TFT according to the second preferred embodiment of the present invention.

FIG. 13 shows the photo-conductivity degradation characteristics in the amorphous silicon fabricated according to the ratio of $SiH_2Cl_2$ to $SiH_4$ when light is continuously applied thereto. Here, the plots designated by (a), (b), (c), (d) and (e) represent the photo-conductivity degradation characteristics when the $SiH_2Cl_2$-to-$SiH_4$ ratio is zero, 0.07, 0.1, 0.4 and 1.0, respectively. As shown in FIG. 13, a degradation characteristic determining constant $\gamma$ is the least for plot (c). Here, $\gamma$ is calculated according to $\sigma_{ph}$ $t^{-\gamma}$ where $\sigma_{ph}$ represents photo-conductivity and t represents exposure time, i.e., $\gamma=0.045$. Thus, the amorphous silicon including chlorine shows very stable photo-conductivity under light illumination.

Figure 14B:
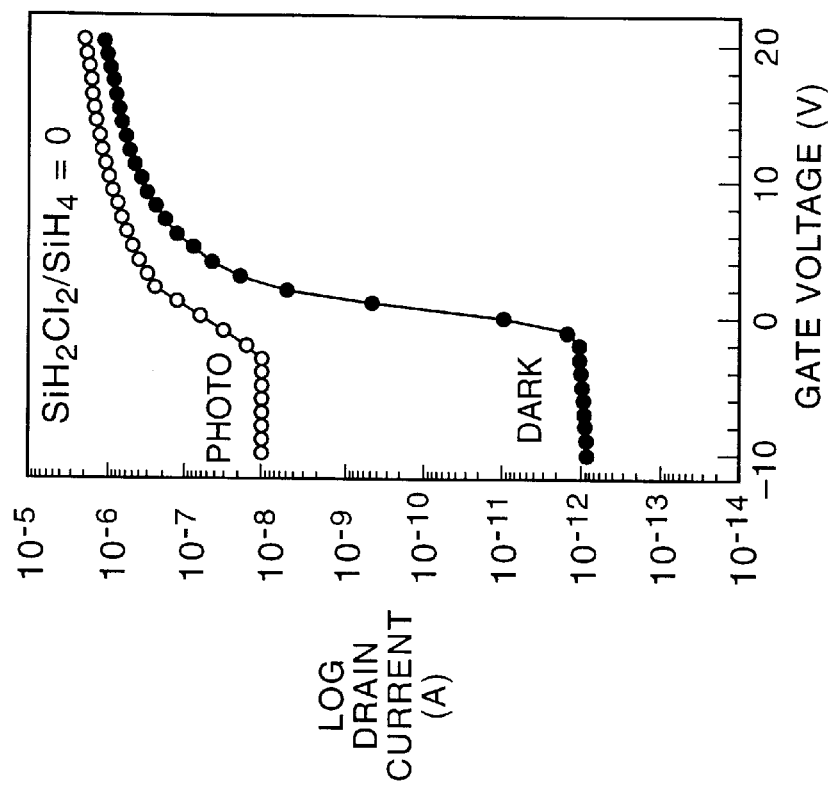
FIGS. 14A and 14B are graphs comparing current-vs-voltage characteristics of a TFT fabricated according to the second preferred embodiment of the present invention and the conventional TFT, under the dark and illuminating conditions.
Figure 14A:
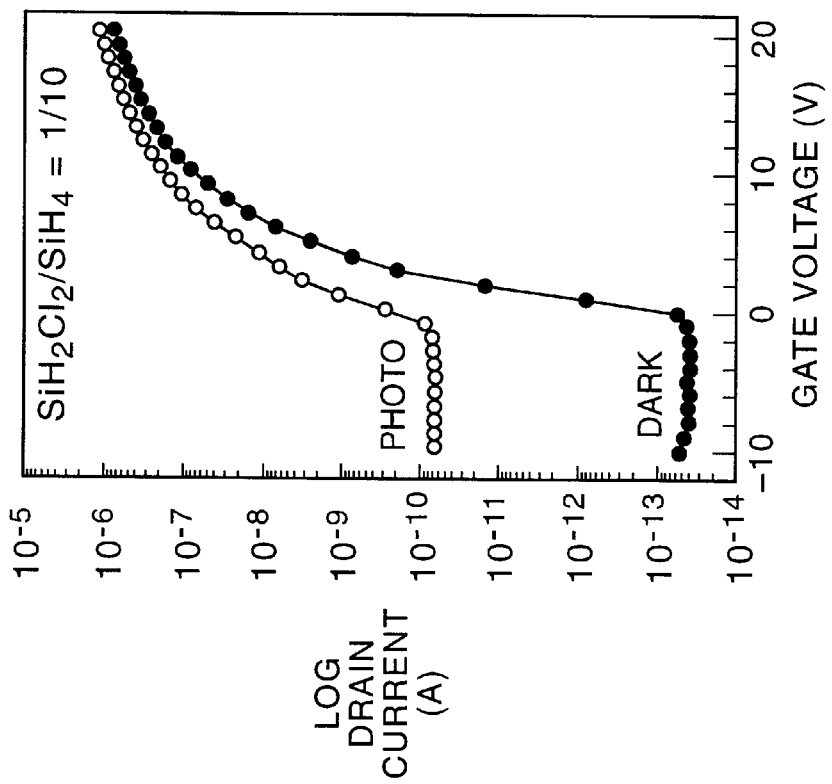

FIGS. 14A and 14B compare the transfer characteristics during the photo- and dark-illumination in the amorphous silicon TFTs with $7\times10^{18}$ $cm^{-3}$ Cl and without chlorine. Here, the source/drain/channel is illuminated with 10 klx of light. As shown in the comparison, when light is applied to the amorphous silicon TFT fabricated according to the second preferred embodiment, the off-current is about 1/100 of the conventional amorphous silicon TFT. Here, too, the drain voltage is 5V.

Therefore, the amorphous silicon TFT of the preferred embodiment decreases the leakage current without decreasing the threshold voltage. Therefore, by applying the above-described TFT to a liquid crystal display as a switching element, screen quality can be improved due to the reduction in leakage current.

As described above, according to the second preferred embodiment of the present invention, the active layer of the amorphous silicon TFT is formed of a-Si:H(:Cl) with low hydrogen content and high stability, thereby decreasing the off-current to about 1/10 of the conventional TFT. Particularly, since the off-current during the light illumination is about 1/100 of the conventional TFT, leakage current is remarkably reduced even when illumination is performed by backlighting.

What is claimed is:

1. An amorphous silicon TFT comprising:
    an insulating substrate;
    a gate electrode formed on said insulating substrate;
    a gate insulating layer formed on said gate electrode;
    an active layer made of hydrogenated amorphous silicon and not containing chlorine formed on said insulating layer;
    a source/drain electrode formed over either side of said gate electrode; and
    an ohmic contact layer made of chlorine-containing microcrystalline silicon interposed between said active layer and said source/drain electrode.

2. An amorphous silicon TFT comprising:
    an insulating substrate;
    a gate electrode formed on said insulating substrate;
    a gate insulating layer formed on said gate electrode;
    a source/drain electrode formed over either side of said gate electrode;
    an active layer made of chlorine-containing hydrogenated amorphous silicon (a-Si:H(:Cl)) having a chlorine content of over 0.1 ppm formed on said gate insulating layer; and
    an ohmic contact layer interposed between said active layer and said source/drain electrode.

3. An amorphous silicon TFT as claimed in claim 1, wherein said gate insulating layer is made of a silicon nitride layer.

4. An amorphous silicon TFT as claimed in claim 1, wherein said ohmic contact layer is doped with N-type impurities.

5. An amorphous silicon TFT as claimed in claim 2, wherein said gate insulating layer is made of a silicon nitride layer.

6. An amorphous silicon TFT as claimed in claim 2, wherein said ohmic contact layer is doped with N-type impurities.

7. An amorphous silicon TFT as claimed in claim 2, wherein the field effect mobility of said active layer is 0.4–0.6 cm$^2$N-sec.

8. An amorphous silicon TFT as claimed in claim 7, wherein the field effect mobility of said active layer is not substantially influenced by the chlorine content of said active layer.

9. An amorphous TFT comprising:

an insulating substrate;

a gate electrode formed on said insulating substrate;

a gate insulating layer formed on said gate electrode;

an active layer including a means for reducing off-current and conductivity, said means for reducing being made of chlorine-containing hydrogenated amorphous silicon (a-Si:H(:Cl)) having a chlorine content of over 0.1 ppm formed on said gate insulating layer;

a source/drain electrode formed over either side of said gate electrode; and an ohmic contact layer interposed between said active layer and said source/drain electrode.

10. An amorphous silicon TFT as claimed in claim 2, wherein said amorphous silicon is non-crystallized.

* * * * *